United States Patent
Mayder

(10) Patent No.: US 7,348,791 B1
(45) Date of Patent: Mar. 25, 2008

(54) HIGH VOLTAGE, HIGH FREQUENCY, HIGH RELIABILITY, HIGH DENSITY, HIGH TEMPERATURE AUTOMATED TEST EQUIPMENT (ATE) SWITCH DESIGN

(75) Inventor: Romi O. Mayder, San Jose, CA (US)

(73) Assignee: Silicon Test System, Inc., San Jose, CA (US)

( * ) Notice: Subject to any disclaimer, the term of this patent is extended or adjusted under 35 U.S.C. 154(b) by 0 days.

(21) Appl. No.: 11/685,873

(22) Filed: Mar. 14, 2007

(51) Int. Cl.
 G01R 31/02 (2006.01)
 G01R 31/26 (2006.01)
 G06F 19/00 (2006.01)
(52) U.S. Cl. .................. 324/764; 324/765; 702/118
(58) Field of Classification Search .......... 324/764, 324/765; 702/118
 See application file for complete search history.

(56) References Cited

U.S. PATENT DOCUMENTS

| | | | |
|---|---|---|---|
| 5,786,615 A | 7/1998 | Saito | |
| 6,500,699 B1 | 12/2002 | Birdsley et al. | |
| 6,678,850 B2 | 1/2004 | Roy et al. | |
| 6,853,181 B1 | 2/2005 | Ostertag | |
| 7,008,092 B2 | 3/2006 | Tanaka et al. | |
| 2005/0158890 A1 | 7/2005 | Ostertag | |
| 2006/0118884 A1 | 6/2006 | Losehand et al. | |

*Primary Examiner*—Evan Pert
(74) *Attorney, Agent, or Firm*—Schneck & Schneck

(57) ABSTRACT

An electronic switching apparatus for use in automated test equipment. The electronic switching apparatus includes a transconducting device having source and drain regions where at least one of the source and drain regions is configured to be coupled to a voltage source. A voltage comparison means is coupled to the transconducting device for determining a relative magnitude of voltage applied to the source and drain regions and a multiplexer has an input coupled to the voltage comparison means for selecting a higher of the relative magnitudes of voltage. A gate adder having an input is coupled to an output of the multiplexer and an output is coupled to a gate of the transconducting device. The gate adder is configured to add a fixed voltage to the higher of the relative magnitudes of voltage. A bulk adder having an input is coupled to an output of the multiplexer and an output is coupled to a bulk of the transconducting device. The bulk adder is configured to subtract a fixed voltage from the higher of the relative magnitudes of voltage.

29 Claims, 3 Drawing Sheets

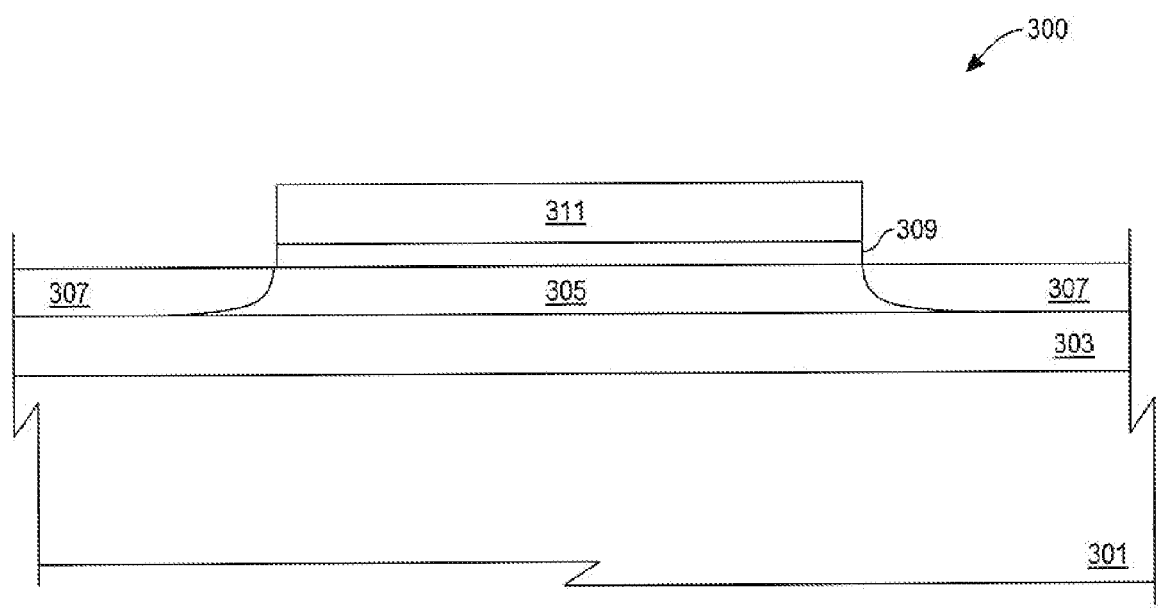
*Fig._3*
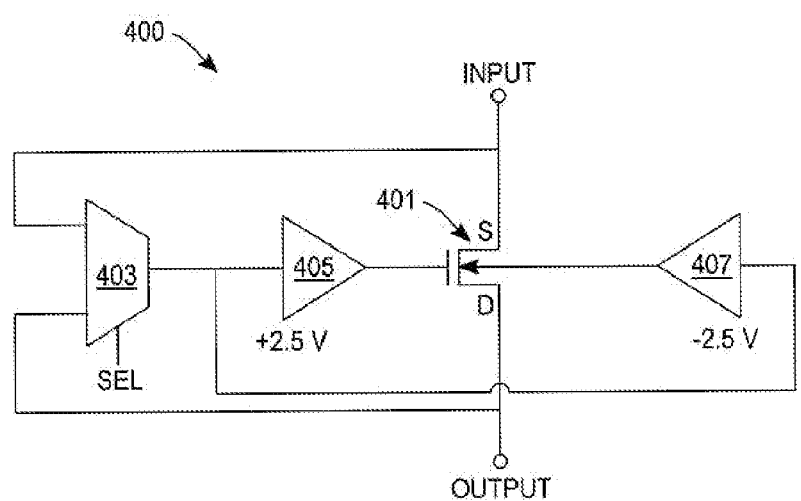
*Fig._4*

US 7,348,791 B1

HIGH VOLTAGE, HIGH FREQUENCY, HIGH RELIABILITY, HIGH DENSITY, HIGH TEMPERATURE AUTOMATED TEST EQUIPMENT (ATE) SWITCH DESIGN

TECHNICAL FIELD

The present invention is related generally to electronic device testing. More specifically, the present invention is related to an electronic switching device contained within an ATE system where the electronic switching device is capable of both high voltage and high frequency switching operations.

BACKGROUND

Complexity levels of electronic device testing vary tremendously, from simple manual low-volume/low-complexity testing performed with perhaps an oscilloscope and voltmeter, to personal computer-based medium-scale testing, to large-scale/high-complexity automated test equipment (ATE). Manual and personal computer-based testing are typically applied when testing discrete devices, specific components of an integrated circuit, or portions of a printed circuit board. In contrast, ATE testing is used to test functionality of a plurality of complex integrated circuits (ICs) such as memory circuits or hundreds of dice on a wafer prior to sawing and packaging.

When testing ICs on a wafer, it is cost effective to test as many devices as possible in parallel, thus reducing the test time per wafer. Test system controllers have evolved to increase the total number of channels and hence the number of devices that can be tested in parallel. However, a test system controller with an increased number of test channels is typically a significant cost factor for a test system, as is a probe card with complex routing lines used to accommodate multiple parallel test channels. Thus, an overall probe card architecture that allows increased test parallelism without requiring increased test system controller channels and without increased probe card routing complexity and cost is desirable.

FIG. 1 shows a block diagram of an automated test system 100 of the prior art. The test system 100 includes a test system controller 101, a test head 105, and a test prober 107. The test system controller 101 is frequently a microprocessor-based computer and is electrically connected to the test head 105 by a communication cable 103. The test prober 107 includes a stage 109 on which a semiconductor wafer 111 may be mounted and a probe card 113 for testing devices under test (DUTs) on the semiconductor wafer 111. The stage 109 is movable to contact the wafer 111 with a plurality of test probes 115 on the probe card 113. The probe card 113 communicates with the test head 105 through a plurality of channel communications cables 117.

In operation, the test system controller 101 generates test data which are transmitted through the communication cable 103 to the test head 105. The test head in turn transmits the test data to the probe card 113 through the plurality of communications cables 117. The probe card then uses these data to probe DUTs (not shown explicitly) on the wafer 111 through the plurality of test probes 115. Test results are then provided from the DUTs on the wafer 111 back through the probe card 113 to the test head 105 for transmission back to the test system controller 101. Once testing is completed and known good dice are identified, the wafer 111 is diced.

Test data provided from the test system controller 101 are divided into individual test channels provided through the communications cable 103 and separated in the test head 105 so that each channel is carried to a separate one of the plurality of test probes 115. Channels from the test head 105 are linked by the channel communications cables 117 to the probe card 113. The probe card 113 then links each channel to a separate one of the plurality of test probes 115.

With reference to FIG. 2, an ATE switching apparatus 200 of the prior art uses a mechanical relay 201 to switch signals feeding a DUT 207 between a high voltage, low frequency driver 203 (frequently referred to as $V_{HH}$) and a high frequency, low voltage driver 205 (frequently called the pin driver). The mechanical relay 201 is chosen to switch the signals as relays inherently have both low resistance and low capacitance values. Low capacitance values of the mechanical relay 201 allow high frequency signals to be routed to the DUT 207. Further, the mechanical relay 201 allows high voltage signals to pass to the DUT 207 are well. Voltages as high as about 13 volts are frequently encountered in ATE testing. A plurality of the mechanical relays 201 may be mounted on the probe card 113 (FIG. 1). However, mechanical relays suffer from several inherent problems including physical size, high current consumption, reliability, and switching speed.

Therefore, what is needed is a simple, economical, and robust means of switching both high voltage/low frequency and low voltage/high frequency electrical signals between a probe card and a DUT. Ideally, switching speeds should be high with a low current draw. Further, the switch should also function bidirectionally to allow resulting data from the DUT to be transferred through the probe card to the system controller.

SUMMARY OF THE INVENTION

In an exemplary embodiment, the present invention is an electronic switching apparatus for use in automated test equipment. The electronic switching apparatus includes a transconducting device having source and drain regions where at least one of the source and drain regions is configured to be coupled to a voltage source. A voltage comparison means is coupled to the transconducting device for determining a relative magnitude of voltage applied to the source and drain regions and a multiplexer has an input coupled to the voltage comparison means for selecting a higher of the relative magnitudes of voltage. A gate adder having an input is coupled to an output of the multiplexer and an output is coupled to a gate of the transconducting device. The gate adder is configured to add a fixed voltage to the higher of the relative magnitudes of voltage. A bulk adder having an input is coupled to an output of the multiplexer and an output is coupled to a bulk of the transconducting device. The bulk adder is configured to subtract a fixed voltage from the higher of the relative magnitudes of voltage.

In another exemplary embodiment, the present invention is an electronic switch for use in automated test equipment. The electronic switch includes a transconducting device electrically isolated from other transconducting devices in a bulk region of a substrate. The transconducting device has source and drain regions with at least one of the source and drain regions configured to be coupled to a voltage source. A voltage comparison means is coupled to the transconducting device for determining a relative magnitude of voltage applied to the source and drain regions and a voltage selection means is coupled to the voltage comparison means for selecting a higher of the relative magnitudes of voltage. A gate adder means is coupled to the voltage selection means for supplying a gate voltage by adding a fixed voltage to the higher of the relative magnitudes of voltage and a bulk adder means is coupled to the voltage selection means for supplying a bulk voltage by subtracting a fixed voltage from the higher of the relative magnitudes of voltage.

In another exemplary embodiment, the present invention is a method of operating an electronic switching apparatus on an automated test equipment system. The method includes determining whether a source voltage or a drain voltage applied to a field effect transistor has a higher relative magnitude, selecting the voltage with the higher relative magnitude, adding the selected higher relative magnitude to a fixed gate voltage value, thereby forming a gate voltage, subtracting a fixed bulk voltage value from the selected higher relative voltage, thereby forming a bulk voltage, applying the gate voltage to a gate of the field effect transistor, and applying the bulk voltage to a bulk of the field effect transistor.

In another exemplary embodiment, the present invention is an electronic circuit within an automated test equipment system. The circuit includes a plurality of serial control registers and a serial program bus coupled to the plurality of serial control registers. The serial program bus is configured to accept a clock signal and data input/output lines. A plurality of semiconductor-based testing switches is configured to be coupled to at least one external device under test; each of the plurality of semiconductor-based testing switches is further coupled to the plurality of serial control registers such that operation of each of the plurality of semiconductor-based testing switches is configured to be controlled by one or more of the plurality of serial control registers. Each of the plurality of semiconductor-based testing switches is further configured to operate concurrently in a high voltage application and a high frequency application. A plurality of voltage input pins is configured to be coupled to an input of one or more of the plurality of semiconductor-based testing switches and a plurality of signal input pins is configured to be coupled to an input of one or more of the plurality of semiconductor-based testing switches.

BRIEF DESCRIPTION OF THE DRAWINGS

FIG. 3 is an cross-sectional view of an exemplary semiconductor fabrication process used to produce semiconductor-based transconducting devices utilized in the present invention.

FIG. 4 is an exemplary embodiment of an electronic switching apparatus of the present invention.

DETAILED DESCRIPTION

Figure 1:
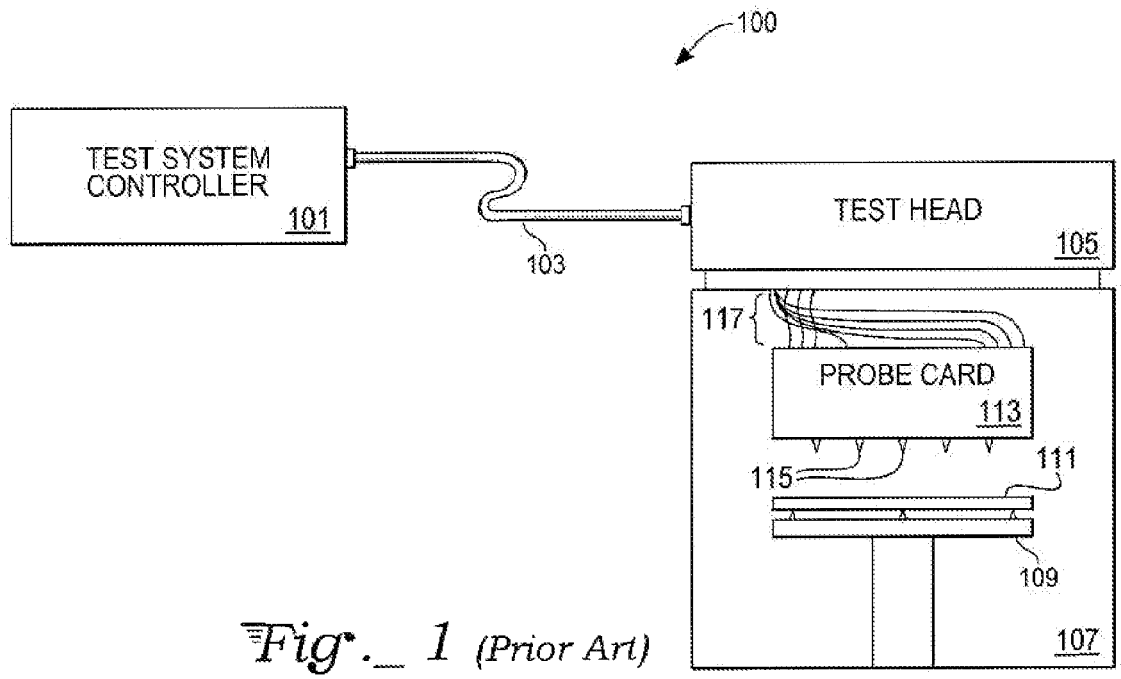
FIG. 1 is a block diagram of an ATE system of the prior art.
Figure 2:
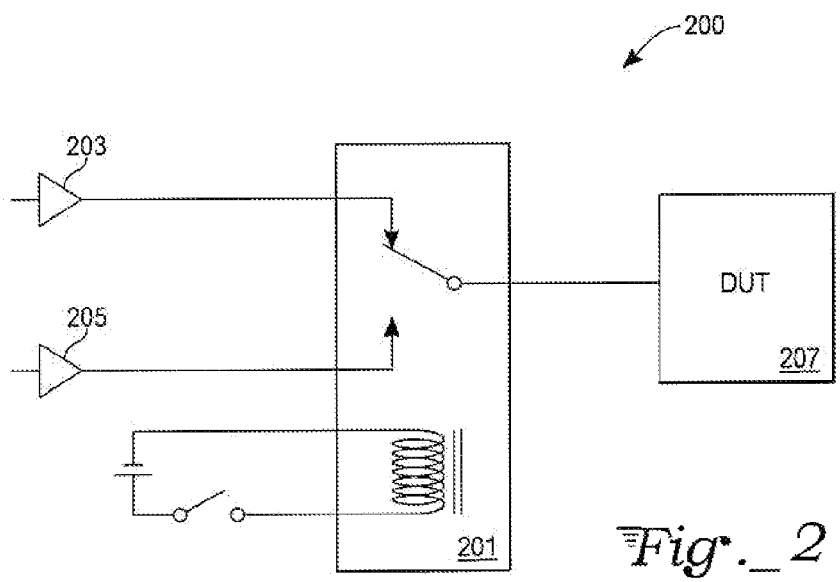
FIG. 2 is an ATE switching device of the prior art employing a mechanical relay.

In discussions presented herein, it will be appreciated by those skilled in the art that field effect transistors (FETs) and similar transistor types are typically configured as symmetrical devices, and consequently, an interchange of the terminals named source and drain has no effect on an operation of the device. In conventional nomenclature, a conventional electrical current is presumed to flow into the source terminal of a PMOS transistor, and out from the source terminal of an NMOS transistor. However, certain applications render the terminology ambiguous. One example is a passgate which may experience control current flow in both directions through the devices comprising the passgate. For this reason, although the terms source and drain are applied herein, it is to be understood that they are not intended as limiting with respect to the direction of current through a device. Rather, the direction of current is to be understood on the basis of the bias potentials applied to the device terminals.

Overall, any semiconductor-based transconducting device, such as a field effect transistor (FET) switching device has an advantage of being physically small in size, reliable due to no mechanical parts, and consuming little current. A switching device in an ATE circuit is ideally capable of operating switchably in either a high voltage/low frequency mode or a high frequency/low voltage mode. However, typical FET switches are designed to operate in either a high voltage mode or a high frequency mode but not both.

In FIG. 3, an exemplary four-terminal FET 300 is fabricated in a metal-on-insulator (MOI) or silicon-on-insulator (SOI) process where an isolated bulk semiconductor material is actively driven by a control signal. The exemplary FET 300 includes a base substrate 301, a first dielectric layer 303, a semiconductor layer 305, a second dielectric layer 309, and a silicided control gate 311. A dopant material is, for example, implanted or diffused into the semiconducting layer 305 to form source and drain regions 307. An electrode (not shown) added in later process steps allows access to the semiconducting layer 305 through a body terminal. Use of the body terminal is described below with reference to FIG. 4.

In a specific exemplary embodiment, the semiconducting layer 305 is approximately 2 μm (2000 nm) in thickness and is bonded to the first dielectric layer 303. The base substrate 301 may be a silicon wafer. Alternatively, another elemental group IV semiconductor or compound semiconductor (e.g., Groups III-V or II-VI) may be selected for the base substrate 301. In lightweight applications or flexible circuit applications, such as employed in a cellular telephone or personal data assistant (PDA), the FET may be formed on a polyethyleneterephtalate (PET) substrate deposited with silicon dioxide and polysilicon followed by an excimer laser annealing (ELA) anneal step. It still other applications, the base substrate 301 may be comprised of a dielectric material directly, such as a quartz photomask, thereby obviating a need for the first dielectric layer 303. In this case, the semiconducting layer 305 may be formed directly over the photomask.

In a case where the base substrate 301 is a semiconductor wafer, the wafer may contain a buried oxide layer (not shown) placed below a polysilicon layer (not shown) to prevent transport of carriers through the underlying bulk seminconducting material. The polysilicon is then treated at an elevated temperature to reform crystalline (i.e., non-amorphous) silicon. In still another embodiment, the base substrate 301 is formed from intrinsic silicon, thereby effectively limiting transport of carriers due to the high resistivity of intrinsic silicon.

If either the substrate 301 or the semiconducting layer 305 is chosen to be comprised of silicon, the second dielectric layer 309 may be a thermally-grown silicon dioxide layer. Alternatively, the second dielectric layer 309 may be a deposited layer, for example, a silicon dioxide, silicon nitride, or oxynitride layer deposited by atomic layer deposition (ALD) or chemical vapor deposition (CVD) techniques. In a specific exemplary embodiment, the second dielectric layer is comprised of silicon dioxide, 10Å to 100Å in thickness.

Regardless of the fabrication techniques employed, either deep or shallow trenches (not shown) may be subsequently etched into the semiconducting layer 305 to isolate either adjacent devices or adjacent circuits. Any silicon-containing layers may be etched, for example, with potassium hydroxide (KOH) or tetra-methyl ammonium hydroxide (TMAH). An edge wall angle of the shallow trench formed within the semiconducting layer 305 will depend on several factors such as a crystallographic orientation of the semiconducting layer 305 and the type of etchant employed. The edge wall angle determines, to some extent, how densely transistor may be fabricated and still remain electrically isolated from one another.

Deep trench isolation techniques are frequently employed to isolate device elements laterally. Formation of deep trench isolation can be partially accomplished with low-cost dielectric films. Low-cost dielectric films typically have less desirable electrical characteristics (e.g., dielectric breakdown strength or higher shrinkage values) than a high-quality film. However, a high-quality dielectric film is a better choice for filling shallow trench isolation (STI) regions and for producing cap layers over a deep trench fill layer. A skilled artisan can readily envision how either deep or shallow trenches may be beneficial to portions of the present invention described herein.

The MOI or SOI process described above allows the exemplary four-terminal FET 300 to have an isolated bulk in the form of the semiconducting layer 305. The bulk may be actively driven by a control signal. As is well-known to a skilled artisan, an applied voltage on the gate of the proper polarity and magnitude creates a channel carrier flow from the source to the drain. However, a differential voltage between the gate and the bulk must be maintained below an inherent oxide breakdown voltage. FETs fabricated with standard fabrication techniques achieve high oxide breakdown voltages by using a thick dielectric (e.g., silicon dioxide). However, capacitance within the FET increases as the dielectric thickness increases, thereby limiting high frequency operations. Therefore an MOI or SOI process, by itself, will not allow both high voltage and high frequency operations.

In FIG. 4, an exemplary electronic switching apparatus 400 uses a four-terminal FET 401 fabricated in accord with the exemplary fabrication process described with reference to FIG. 3. Functionally, the electronic switching apparatus 400 will vary depending upon use. The electronic switching apparatus 400 will function differently when utilized in high voltage applications as compared with high frequency applications.

Using the electronic switching apparatus 400 for high voltage applications, input voltages to a multiplexer 403 are supplied from source and drain contacts on the four-terminal FET 401. The source and drain voltages supplied to the multiplexer 403 are measured (e.g., with a comparator, not shown). The multiplexer 403 is arranged to select the higher of the source or drain voltage. The higher of the source or drain voltage is added to a fixed voltage through a gate adder 405 or a bulk adder 407. For example, the gate adder adds a positive 2.5 V to the higher voltage to be applied to the gate and the bulk adder 407 adds a negative 2.5 V to the higher voltage to be applied to the bulk of the four-terminal FET transistor 401. Consequently, a differential voltage between the gate and bulk is fixed at about 5 V regardless of the voltage applied to either the source or drain or the voltage differential between them. Operating frequencies up to approximately 10 MHz may be obtained by measurement and application of the drain or source voltage with the fixed voltage. The 10 MHZ frequency is sufficiently fast to allow switching of typical $V_{HH}$ signals commonly used in ATE systems testing DUTs.

For high frequency applications (e.g., 100 MHz or higher), the MOI or SOI fabricated structure of the four-terminal FET 401 has low parasitic capacitance levels. Therefore, high frequency signals may be switched directly without using the multiplexer 403 and other associated circuitry (i.e., the gate 405 and bulk 407 adders) of the exemplary electronic switching apparatus 400. In high frequency applications, a comparator (not shown) is used to disable the gate 405 and bulk 407 adder. A first input of the comparator is set to 5 volts. A second input to the comparator is coupled to the output of the multiplexer 403. If the output of the multiplexer 403 is less than 5 volts, then the gate 405 and bulk 407 adder are each disabled. If the output of the multiplexer 403 is greater than or equal to 5 volts, then the gate 405 and bulk 407 adder are enabled for high voltage applications.

Figure 5:
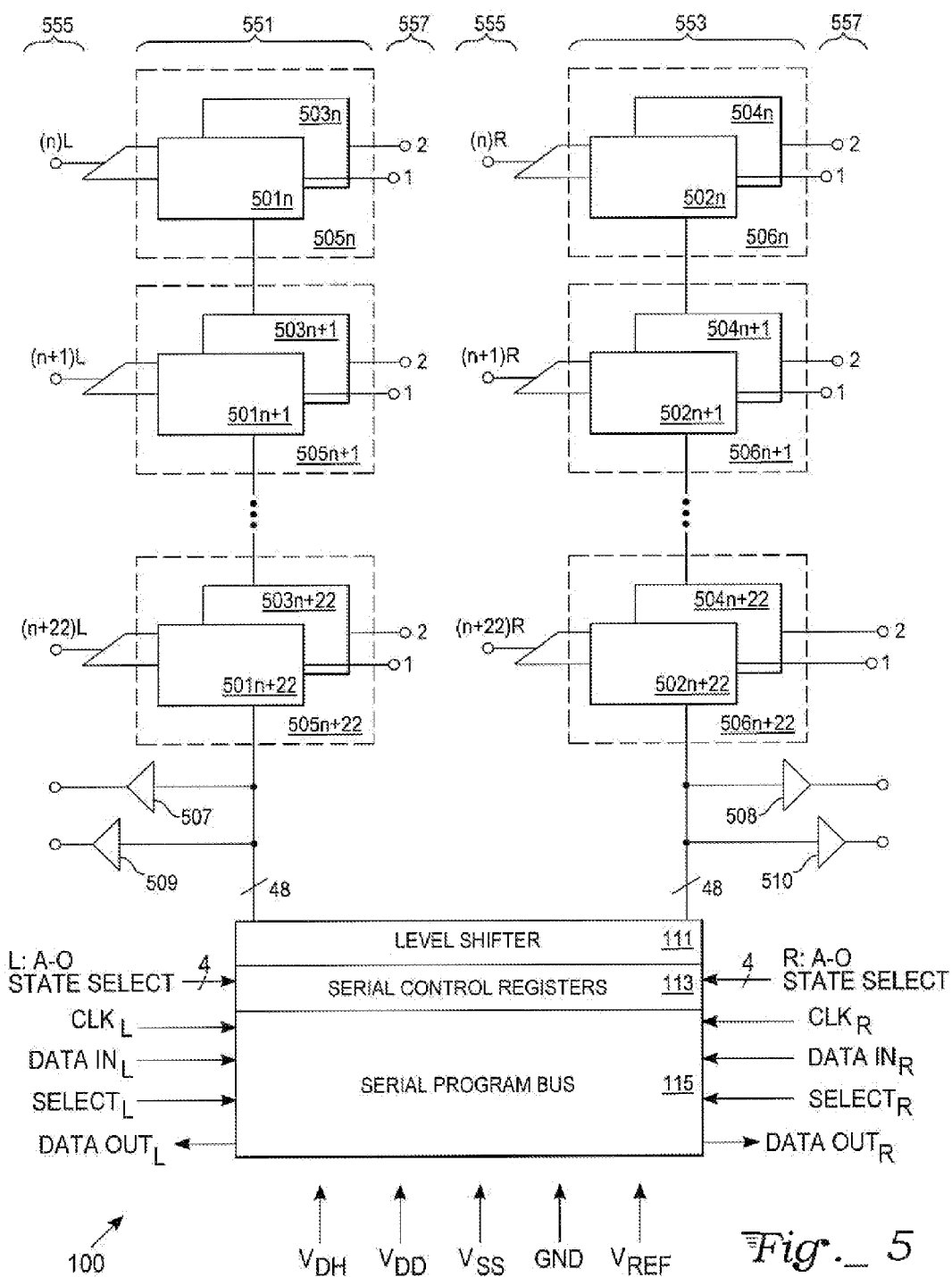
FIG. 5 is a functional schematic diagram of an exemplary embodiment of a DC and signal routing electronic switching apparatus of the present invention used for testing electronic devices.

With reference to FIG. 5, a portion of an exemplary application specific integrated circuit (ASIC) based DC and signal routing switch 500 includes a plurality of single-pole single-throw (SPST) switches 501-504, driver circuits 507-510, a level shifter 511, a plurality of serial control registers 513, and a serial program bus 515. The ASIC-based DC and signal routing switch 500 has a plurality of inputs including several voltage levels ($V_{DH}$, $V_{DD}$, $V_{SS}$, and $V_{REF}$ plus GND), one or more clock inputs, $CLK_L$ and $CLK_R$, and data. The ASIC-based DC and signal routing switch 500 utilizes built-in control logic employing, for example, a serial bus to configure all internal switches. There is also a toggle feature. In an exemplary embodiment, the toggle feature allows an end user to switch from write DUT A, DUT B, DUT C, and DUT D to read DUT B and DUT D and to read DUT A and DUT C in parallel in less than 10 nanoseconds (ns).

Each of the plurality of SPST switches 501-504 (where "n" is an integer) may be fabricated using the fabrication technology of the FET 300 (FIG. 3) described above along with the exemplary electronic switching apparatus 400. The electronic switching apparatus 400 allows a nanosecond-level switching speeds. As a result of the high switching speed, time domain measurements may be performed thus measuring transient responses of DUTs. Each of the plurality of electronic switching apparatus 400 directs signals to multiple DUTS while simultaneously testing the DUTs. In this exemplary embodiment, there are 46 switches (i.e., 23 pairs of SPST switches) in a left circuit branch 551 and 46 switches in a right circuit branch 553. Each pair of switches 501, 503 in the left circuit branch 551 define a single-pole double-throw (SPDT) switch 505. Similarly, each pair of switches 502, 504 in the right circuit branch 553 define a SPDT switch 506. Thus, the ASIC-based DC and signal routing switch 500 provides for a 46 input 1:2 DC and high frequency signal distribution array. (A skilled artisan will recognize that any number of switches may actually be incorporated.) As described in more detail below, each 1:2 branch is serially addressable allowing all outputs to be individually controlled. This configuration allows signal routing between multiple inputs and outputs. Further, multiple routing switches 500 may be used in combination for testing more complex and/or multiple numbers of DUTs in parallel simultaneously. Hence, all ports or device pins of a DUT may be tested simultaneously. Further, the ability of employ multiple routing switches 500 is particularly desirable when performing wafer-level probing.

A plurality of data signal or voltage level inputs 555 may be accessed directly. The direct access may be through primary pins located on, for example, a land grid array (LGA) or ball-grid array (BGA) located on the bottom side of a package in which the ASIC is mounted (not shown). A person of skill in the art will readily recognize that the ASIC may be packaged in various forms including micro-BGA (µBGA), bump-chip carrier (BCC), controlled-collapse chip connection (C4), or a variety of other packaging types known in the art. A plurality of switched outputs 557 are available to route, for example, a data signal or voltage to a plurality of DUTs (not shown). Each of the outputs are individually addressable and configurable through the plurality of serial control registers 513 and the serial program bus 515. The individual addressability allows flexibility in configuration with particular types and numbers of DUTs.

The driver circuits 507-510 may be, for example, LED drive circuits, photovoltaic drive circuits, or various other types of low-level current drive circuits known in the art. Alternatively, the driver circuits 507-510 could be a combination of various types of drive circuits. Each of the driver circuits 507-510 may be independently addressable through the plurality of serial control registers 513 and the serial program bus 515.

Each of the left circuit 551 and right circuit 553 branches is coupled to the level shifter 511. The level shifter 511 changes a logic level at an interface between two types of semiconductor logic systems. Such circuits are known in the art. Additionally, each circuit branch 551, 553 may have independent state control through the plurality of serial control registers 513 and the serial program bus 515. Consequently, either the left circuit branch 551 or the right circuit branch 553 may be separately serially loaded. Alternatively, a plurality of the ASIC-based DC and signal routing switches 500 may be daisy chained externally for controlling large numbers of DUTs through coupling the ASIC switches 500 with an ATE system.

A state toggle operation may be used with the plurality of serial control registers 513. A separate state select input for each circuit branch 551, 553 allows separate branch control. As indicated in Table 1 below, selection of 15 states (A-O) may be made through four logic inputs comprised of toggle select lines $T_0$-$T_3$. Thus, 15 selectable switch configurations may be preloaded based on requirements for various DUTs.

TABLE 1

| Mode | $T_3$ | $T_2$ | $T_1$ | $T_0$ |
|---|---|---|---|---|
| Protect | 0 | 0 | 0 | 0 |
| A | 0 | 0 | 0 | 1 |
| B | 0 | 0 | 1 | 0 |
| C | 0 | 0 | 1 | 1 |
| D | 0 | 1 | 0 | 0 |
| E | 0 | 1 | 0 | 1 |
| F | 0 | 1 | 1 | 0 |
| G | 0 | 1 | 1 | 1 |
| H | 1 | 0 | 0 | 1 |
| I | 1 | 0 | 0 | 1 |
| J | 1 | 0 | 1 | 0 |
| K | 1 | 0 | 1 | 1 |
| L | 1 | 1 | 0 | 0 |
| M | 1 | 1 | 0 | 1 |
| N | 1 | 1 | 1 | 0 |
| O | 1 | 1 | 1 | 1 |
| P | NA | NA | NA | NA |

A transient signal protection mode is enabled utilizing the state input toggles. The transient signal protection mode is useful while no active signals are applied to input or output pins of the ASIC-based DC and signal routing switch 500. The transient signal protection mode is enabled when DUT or other device connections are being performed during normal operation. In this exemplary embodiment, while the ASIC routing switch 500 is powered off, transient signal protection is achieved through normal pad protection structures known in the art. Also, the protect mode could be used to, for example, simply shut off all devices. Alternatively, the protect mode could be used to shut off devices in certain groups according to various user inputs in the programmable section consisting of the plurality of serial control registers 513 and the serial program bus 515. Further, when a "P" mode is loaded high through the serial program bus 515, toggle select lines $T_0 \ldots T_3$ are ignored. Thus, output switch positions are locked to mode "A."

In an exemplary embodiment, serial data are shifted through the plurality of serial control registers on a rising edge of a clock input. Note that each of the left 551 and right 553 circuit branched may be supplied with the same clock signal. Alternatively, each clock may have a different frequency or one clock feeding one circuit branch may be delayed with respect to the other circuit branch. Generally, the clock is established prior to data programming.

The serial program bus 515 used to control the internal switches within the ASIC-based DC and signal routing switch 500 supports a standard serial-peripheral interface (SPI) protocol commonly used with EEPROM memory cells. Hence, the ASIC-based DC and signal routing switch 100 can be used on any tester platform such as Advantest$^x$, Verigy, Nextest™, Credence, Ando, Teradyne, and others. The serial program bus 515 greatly reduces the pin count of the ASIC switch array 100 allowing a high density of the ASIC switch arrays 500 to be placed on, for example, a printed circuit board or probe head.

In the foregoing specification, the present invention has been described with reference to specific embodiments thereof. It will, however, be evident to a skilled artisan that various modifications and changes can be made thereto without departing from the broader spirit and scope of the present invention as set forth in the appended claims. For example, although process steps and techniques for the MOI and SOI transistor fabrication are shown and described in detail, a skilled artisan will recognize that other techniques and methods may be utilized which are still included within a scope of the appended claims. For example, there are frequently several techniques used for depositing a film layer (e.g., chemical vapor deposition, plasma-enhanced vapor deposition, epitaxy, atomic layer deposition, etc.). Although not all techniques are amenable to all film types described herein, one skilled in the art will recognize that multiple methods for depositing a given layer and/or film type may be used. Additionally, other circuit elements are known to a skilled artisan that achieve substantially the same effect as exemplary circuits and circuit elements described herein. For example, the multiplexer and/or adder circuits may be selectively replaced with other elements, such as comparators, voltage selectors, or other type of logic elements. The FETs may also be replaced with other types of transconducting devices known to one of skill in the art. These and various other embodiments and techniques are all within a scope of the present invention. The specification and drawings are, accordingly, to be regarded in an illustrative rather than a restrictive sense.

What is claimed is:

1. An electronic switching apparatus for use in automated test equipment, the electronic switching apparatus comprising:
  a transconducting device having source and drain regions, at least one of the source and drain regions configured to be coupled to a voltage source;
  a voltage comparison means coupled to the transconducting device for determining a relative magnitude of voltages applied to the source and drain regions;
  a multiplexer having an input coupled to the voltage comparison means for selecting a higher of the relative magnitudes of voltage;
  a gate adder having an input coupled to an output of the multiplexer and an output coupled to a gate of the transconducting device, the gate adder configured to add a fixed voltage to the higher of the relative magnitudes of voltage; and
  a bulk adder having an input coupled to the output of the multiplexer and an output coupled to a bulk of the transconducting device, the gate adder configured to subtract a fixed voltage from the higher of the relative magnitude of voltage.

2. The electronic switching apparatus of claim 1 wherein the transconducting device is electrically isolated from any other transconducting devices contained within a bulk region of a substrate.

3. The electronic switching apparatus of claim 1 wherein the source is configured to be coupled to an output from the automated test equipment and the drain is configured to be coupled to a device under test.

4. The electronic switching apparatus of claim 1 wherein the transconducting device is a field effect transistor.

5. The electronic switching apparatus of claim 1 wherein the transconducting device is fabricated on a metal-on-insulator substrate.

6. The electronic switching apparatus of claim 1 wherein the transconducting device is fabricated on a silicon-on-insulator substrate.

7. An electronic switch for use in automated test equipment, the electronic switch comprising:
  a transconducting device electrically isolated from other transconducting devices in a bulk region of a substrate, the transconducting device having source and drain regions, at least one of the source and drain regions configured to be coupled to a voltage source;
  a voltage comparison means coupled to the transconducting device for determining a relative magnitude of voltages applied to the source and drain regions;
  a voltage selection means coupled to the voltage comparison means, the voltage selection means for selecting a higher of the relative magnitudes of voltage;
  a gate adder means coupled to the voltage selection means, the gate adder means for supplying a gate voltage by adding a fixed voltage to the higher of the relative magnitudes of voltage; and
  a bulk adder means coupled to the voltage selection means, the bulk adder means for supplying a bulk voltage by subtracting a fixed voltage from the higher of the relative magnitude of voltage.

8. The electronic switching apparatus of claim 7 wherein the source is configured to be coupled to an output from the automated test equipment and the drain is configured to be coupled to a device under test.

9. The electronic switching apparatus of claim 7 wherein the transconducting device is a field effect transistor.

10. The electronic switching apparatus of claim 7 wherein the transconducting device is fabricated on a metal-on-insulator substrate.

11. The electronic switching apparatus of claim 7 wherein the transconducting device is fabricated on a silicon-on-insulator substrate.

12. A method of operating an electronic switching apparatus on an automated test equipment system, the method comprising:
  determining whether a source voltage or a drain voltage applied to a field effect transistor has a higher relative magnitude;
  selecting the voltage with the higher relative magnitude;
  adding the selected higher relative magnitude to a fixed gate voltage value, thereby forming a gate voltage;
  subtracting a fixed bulk voltage value from the selected higher relative voltage, thereby forming a bulk voltage;
  applying the gate voltage to a gate of the field effect transistor; and
  applying the bulk voltage to a bulk of the field effect transistor.

13. The method of claim 12 wherein the fixed gate voltage value and the fixed bulk voltage value are each selected to be of equal magnitude and opposite polarity.

14. The method of claim 13 wherein the fixed gate voltage value is selected to by positive 2.5 volts.

15. The method of claim 13 wherein the fixed gate voltage value is selected to by negative 2.5 volts.

16. An electronic circuit within an automated test equipment system, the circuit comprising:
  a plurality of serial control register;
  a serial program bus coupled to the plurality of serial control registers, the serial program bus configured to accept a clock signal and data input/output lines;
  a plurality of semiconductor-based testing switches configured to be coupled to at least one external device under test, each of the plurality of semiconductor-based testing switches further coupled to the plurality of serial control registers such that operation of each of the plurality of semiconductor-based testing switches is configured to be controlled by one or more of the plurality of serial control registers, each of the plurality of semiconductor-based testing switches including:
    a multiplexer configured to determine a relative magnitude of voltages applied across the switches;
    a first adder configured to add a fixed voltage to the higher of the relative magnitudes of voltage and apply the voltage to each of the plurality of semiconductor-based testing switches; and
    a second adder configured to subtract a fixed voltage from the higher of the relative magnitudes of voltage and apply the voltage to each of the plurality of semiconductor-based testing switches;
  a plurality of voltage input pins configured to be coupled to an input of one or more of the plurality of semiconductor-based testing switches; and
  a plurality of signal input pins configured to be coupled to an input of one or more of the plurality of semiconductor-based testing switches.

17. The electronic circuit of claim 16 wherein the serial program bus is further configured to accept a select line.

18. The electronic circuit of claim 16 wherein all components of the circuit are fabricated as a single application specific integrated circuit.

19. The electronic circuit of claim 16 further comprising a level shifter coupled to the plurality of serial control registers.

20. The electronic circuit of claim 16 further comprising one or more current driver circuits.

21. The electronic circuit of claim 16 further comprising:
a plurality of diagnostic switches, each of the plurality of diagnostic switches coupled to at least one of the plurality of semiconductor-based testing switches; and
a plurality of diagnostic registers, each of the plurality of diagnostic registers coupled to at least one of the plurality of diagnostic switches and configured to control an operation of the diagnostic switch.

22. The electronic circuit of claim 21 wherein ones of the plurality of diagnostic switches are configured to couple ones of the plurality of semiconductor-based testing switches, thus allowing any input signal to run into a common port and read back from an adjacent common port.

23. The electronic circuit of claim 16 wherein the plurality of semiconductor-based testing switches is split into two branches.

24. The electronic circuit of claim 23 wherein each of the two branches includes 46 semiconductor-based testing switches.

25. The electronic circuit of claim 16 wherein pairs of the plurality of semiconductor-based testing switches each form an single-pole double-throw switch.

26. The electronic circuit of claim 16 wherein the plurality of semiconductor-based testing switches is configured to be toggled between reading from and writing to one or more devices under test.

27. The electronic circuit of claim 16 wherein each of the plurality of semiconductor-based testing switches is an FET.

28. The electronic circuit of claim 16 wherein each of the plurality of semiconductor-based testing switches further includes:
a transconducting device having source and drain regions, at least one of the source and drain regions configured to be coupled to a voltage source; and
a voltage comparison means coupled to the transconducting device for determining a relative magnitude of voltage applied to the source and drain regions.

29. The electronic circuit of claim 28 wherein:
the first adder is a gate adder having an input coupled to an output of the multiplexer and an output coupled to a gate of the transconducting device; and
the second adder is a bulk adder having an input coupled to an output of the multiplexer and an output coupled to a gate of the transconducting device.

* * * * *

UNITED STATES PATENT AND TRADEMARK OFFICE
CERTIFICATE OF CORRECTION

| | | |
|---|---|---|
| PATENT NO. | : 7,348,791 B1 | |
| APPLICATION NO. | : 11/685873 | |
| DATED | : March 25, 2008 | |
| INVENTOR(S) | : Romi O. Mayder | |

It is certified that error appears in the above-identified patent and that said Letters Patent is hereby corrected as shown below:

In the Specification, Column 6, Line 67, "Further, the ability of" should read --Further, the ability to--.

In the Specification, Column 7, Line 59, Table 1, Mode H, column T, "1" should read --0--.

In the Specification, Column 8, Line 23, "553 circuit branched" should read --553 circuit branches--.

In the Claims, Column 10, Lines 27-28, Claim 15, "The method of claim 13 wherein the fixed gate voltage value is selected to by negative 2.5 volts." should read --The method of claim 13 wherein the fixed bulk voltage value is selected to be negative 2.5 volts.--.

Signed and Sealed this

First Day of September, 2009

David J. Kappos
*Director of the United States Patent and Trademark Office*